United States Patent [19]

Nelson

[11] Patent Number: 4,472,876
[45] Date of Patent: Sep. 25, 1984

[54] AREA-BONDING TAPE

[75] Inventor: J. Robert Nelson, White Bear Lake, Minn.

[73] Assignee: Minnesota Mining and Manufacturing Company, St. Paul, Minn.

[21] Appl. No.: 292,401

[22] Filed: Aug. 13, 1981

[51] Int. Cl.³ .......................... H05K 1/11; H05K 3/32
[52] U.S. Cl. ................................ 29/840; 174/52 FP; 174/117 PC; 361/398; 361/414
[58] Field of Search .................... 174/117 PC, 52 FP; 361/398, 414; 339/17 F; 29/832, 840

[56] References Cited

U.S. PATENT DOCUMENTS

| | | | |
|---|---|---|---|
| 3,628,999 | 12/1971 | Schneble, Jr. | 361/414 X |
| 3,683,105 | 8/1972 | Shamash | 174/52 FP X |
| 3,780,352 | 12/1973 | Redwanz . | |
| 3,781,596 | 12/1973 | Galli et al. | 361/398 |
| 3,832,769 | 9/1974 | Olyphant, Jr. et al. . | |
| 3,868,724 | 2/1975 | Perrino . | |
| 4,064,552 | 12/1977 | Angelucci et al. . | |
| 4,141,614 | 2/1979 | Piccirillo | 339/17 F |
| 4,184,729 | 1/1980 | Parks et al. | 339/17 F |
| 4,195,193 | 3/1980 | Grabbe et al. | 174/52 FP |
| 4,251,852 | 2/1981 | Ecker et al. . | |
| 4,289,922 | 9/1981 | Devlin | 174/52 FP |
| 4,331,740 | 5/1982 | Burns | 174/52 FP X |

FOREIGN PATENT DOCUMENTS 1209901 10/1970 United Kingdom ........... 174/52 FP

OTHER PUBLICATIONS

Anletta, L. V. and Marks, R. "Flexible Tape Conductor Interconnection for Chips", IBM Technical Disclosure Bulletin, vol. 24, No. 2, Jul. 1981.

Primary Examiner—Laramie E. Askin
Assistant Examiner—Morris H. Nimmo
Attorney, Agent, or Firm—Donald M. Sell; James A. Smith; James V. Lilly

[57] ABSTRACT

A flexible area-bonding tape comprising a flexible, electrically insulating body, and arrays of internal and external terminals which are electrically interconnected by multiplicities of conductive paths. At least some of the paths are essentially completely embedded in the body.

9 Claims, 13 Drawing Figures

AREA-BONDING TAPE

TECHNICAL FIELD

This invention is directed to articles and methods useful in electrically interconnecting electronic components. More particularly it is directed to flexible tape constructions having a flexible electrically insulating body, and arrays of internal and external terminals in said body which are electrically interconnected by a multiplicity of conductive paths. The paths are provided in more than one level so as to make maximum use of the available space for the internal and external terminals. At least some of the conductive paths are essentially completely embedded or buried within the body. The tape is particularly useful in electrically connecting small electronic components, such as semiconductor chips, to external circuitry, such as ceramic packages.

BACKGROUND ART

Small electronic components, such as semiconductor chips or devices, have their bonding locations for providing electrical connection to external circuitry either on the periphery of one face or in an array spread over a large portion of one face. Devices employing peripheral bonding locations provide only a limited number of access points for electrical connection due to the small area available for such points. Devices employing an array of contact points (also known as "flip chip" devices) overcome this disadvantage by increasing the area available for such points.

Flip chip devices are commonly electrically interconnected to external circuitry by aligning its array of bonding locations, such as metallized bumps, with corresponding bonding locations on the external circuitry and forming a metallurgical bond between the two sets of bonding locations by, for example, reflow soldering, thermocompression bonding, or ultrasonic bonding.

There are at least two serious drawbacks to this interconnection technique. First, there is a large difference in the coefficients of thermal expansion of electronic components such as semiconductor devices typically made from silicon, and external circuitry, such as a ceramic package, typically made from alumina. This difference causes physical stresses on the metallurigical bond between the bonding locations during the thermal cycling encountered during testing and use of the assembled part. The stress must be limited if failure of the metallurigical bond is to be avoided. Commonly the thermal cycling range to be encountered by the assembled part is specified and cannot be limited to less than that specified. Consequently, limiting the stress must be accomplished by limiting the physical magnitude of the stress, typically by limiting the maximum difference in distance between any bonding locations in the array. This limits the size of the array and, consequently, the placement of the bonding locations on the device.

Second, it is normally necessary to remove heat generated during electrical functioning of the semiconductor device. The most effective means of removal is by conducting the heat from the device to the substrate. This is best accomplished by maximizing the contact between the semiconductor device and the ceramic package. However, in the case of flip chip devices, the contact area is limited to the area of the metallurgical bonds. This can be as small as 5% of the area of the device and can cause a severe impairment of removal of heat from the device to the substrate.

The present invention overcomes these disadvantages. It provides a compliant or flexible article which can absorb the stress caused by thermal expansion mismatch. As a result, the bonding locations may be located anywhere on the face of the semiconductor device rather than only in an array of limited size. As a result, more electrical connection points may be provided on a semiconductor device.

The present invention also permits one surface of the device to be placed in maximum contact with the substrate while the bonding locations on the other surface of the device can be placed in thermal contact with the tape, thereby permitting maximum thermal transfer.

Still further the present invention permits direct electrical contact to the back of the device if desired. This is particularly useful when it is desired to electrically ground the device.

The present invention provides still another advantage. Thus, when applied to the electronic component and the external circuitry it protects the assembled device from alpha particles which would otherwise impinge upon the electronic component and undesirably change its electrical state.

Several devices have been previously suggested for interconnecting electronic components to external circuitry. However, these devices have either been intended for use in electrically interconnecting devices which employ peripheral contact points, or they lack one or more of the essential elements of the present invention.

For example, U.S. Pat. Nos. 3,832,769 and 3,868,724 disclose structures wherein a pattern of electrical contacts on one surface are electrically interconnected to a pattern of electrical contacts on another surface. These structures employ only single layers of a dielectric material and a conductive material to join the two patterns of electrical contacts. This type of structure provides only limited space for electrical contact points.

U.S. Pat. No. 4,064,552 describes a tape bearing a foil pattern thereon which has individual electrical terminals to receive components. The foil pattern is on a dielectric carrier and has interlayered connections through apertures in the carrier. The dielectric layers of the tape are adhesively secured to one another.

U.S. Pat. No. 3,780,352 discloses a structure wherein a set of thin metallic film strips are bonded to a thin flexible dielectric support. The metal strips interconnect the contact pads on semiconductor chips and selected leads to electrically interconnect the semiconductor device and the leads.

U.S. Pat. No. 4,251,852 discloses a wiring skirt for electrically interconnecting two identical semiconductor chips to a common set of contacts. The wiring skirt is built in situ around the semiconductor chips.

DISCLOSURE OF THE INVENTION

The present invention provides a flexible area-bonding tape for providing electrical interconnections between electronic components and external circuitry. The tape comprises a flexible, solid, electrically insulating body having a predetermined array of internal terminals for electrical interconnection to the electrical components and a predetermined array of external terminals for electrical interconnection to the external circuitry. The internal and external terminals are electrically interconnected by a multiplicity of conductive paths provided in more than one layer, at least some of which are completely embedded or buried within the body. Thus, the tape of the invention is comprised of multiple, alternate layers of an electrical conductor, and an insulating body.

The electrically conductive paths are comprised of discrete electrically conductive traces of a desired geometry so as to interconnect the individual terminals of the array of internal terminals to desired terminals of the array of external terminals. The material of the insulating body separates the various conductive traces and contains holes or vias which permit the traces to be routed in a number of ways so as to provide the maximum latitude in the design of the various arrays of terminals.

BRIEF DESCRIPTION OF THE DRAWINGS

The invention will be described in more detail hereinafter with reference to the accompanying drawings wherein like reference characters refer to the same parts throughout the several views and in which:

FIG. 2 shows the bottom surface of the tape, FIG. 3 shows the interior layer of the tape, and FIG. 4 shows the top surface of the tape;

DETAILED DESCRIPTION

Figure 1:
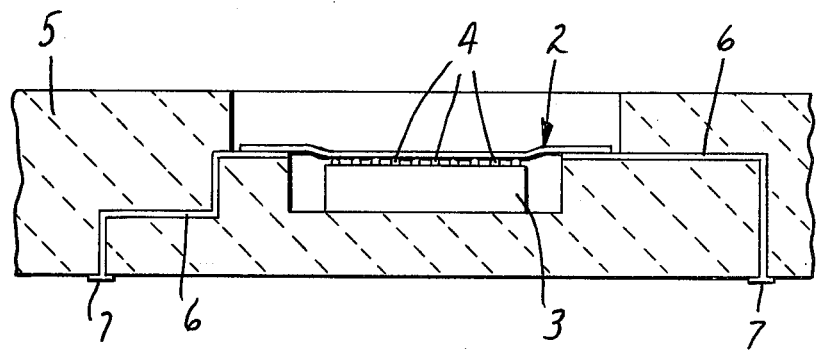
FIG. 1 is a cross-section view showing one embodiment of the tape of the invention interconnecting an electronic component, here a semiconductor chip, to external circuitry, here a ceramic package.

FIG. 1 shows a cross-section view of area-bonding tape 2 interconnecting an array of bonding locations 4 (here bumps) of a semiconductor chip 3 (the electronic component) to conductive paths 6 of ceramic package 5 (the external circuitry). As shown in FIG. 1, conductive paths 6 of package 5 terminate in outer bonding locations 7.

Figure 2:
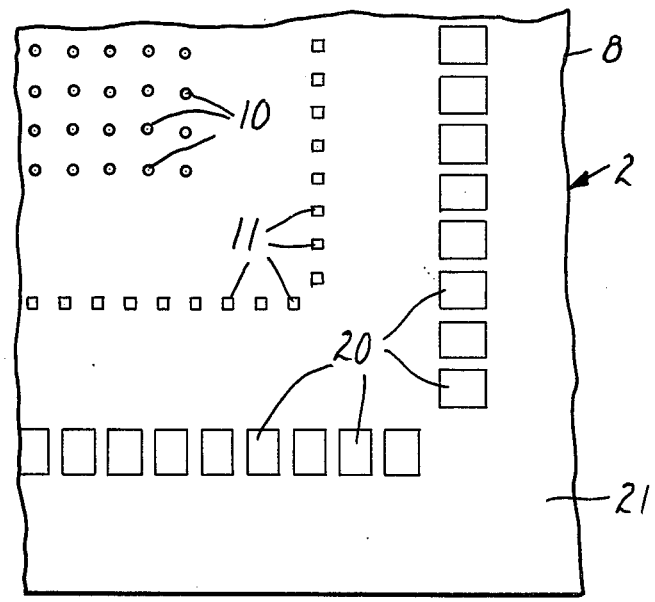
FIGS. 2-4 show details of the tape of the invention. Specifically
Figure 3:
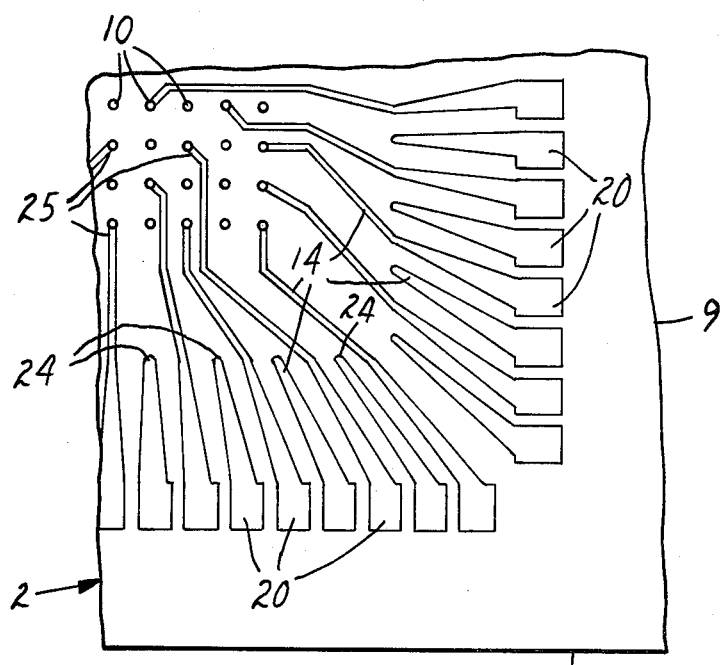
Figure 4:
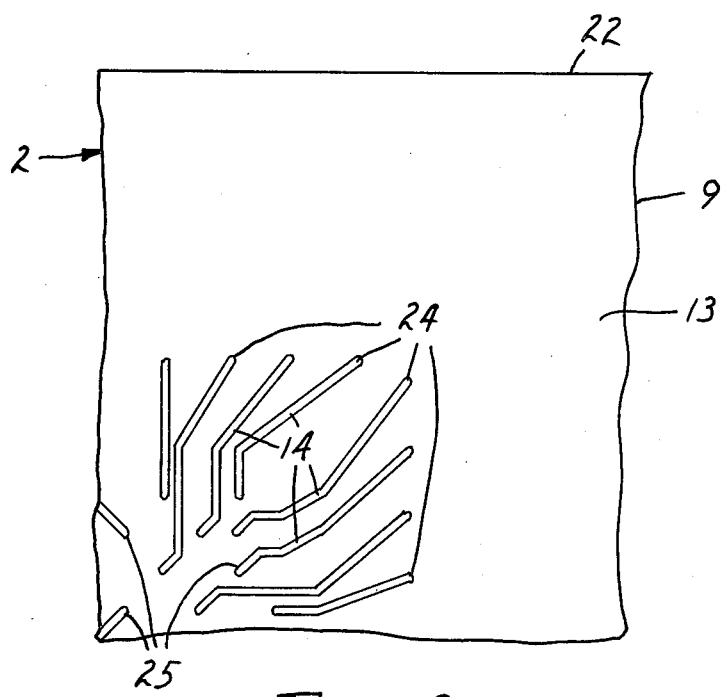

FIGS. 2-4 show details of the tape 2. Thus, FIG. 2 shows the bottom surface 21 of tape 2. This is the surface which interfaces with, and contacts, chip 3 and package 5. It comprises a dielectric material 8, an array of internal terminals 10, and an array of external terminals 11. FIG. 2 also shows an array of test terminals 20. These terminals are optional, that is they are not essential to the invention. Internal terminals 10, external terminals 11, and test terminals 20 are electrically interconnected by means of conductive paths 14.

FIG. 3 shows the interface between layers 8 and 9 of tape 2 after removing layer 8. FIG. 4 shows the top of tape 2, that is the back side of FIG. 3. The surface 13 shown in FIG. 4 would be applied to the view shown in FIG. 3 by attaching the two FIGURES along line 22 and then rotating FIG. 4 into the plane of the sheet. The ends 24 of conductive paths 14 from each FIGURE would then be in alignment as would the ends 25 and those terminals 10 shown in FIG. 3 as not being attached to any conductive paths 14.

As shown in these figures, conductive paths 14 are at least partially electrically isolated from one another and are situated on layer 9 of the body of the tape 2. Conductive paths 14 are present on both sides of layer 9. Thus, FIG. 3 shows a pattern of conductive paths 14 as it might exist between layers 8 and 9 of tape 2 while FIG. 4 shows a pattern of conductive paths 14 as it would exist on top surface 13 of layer 9, which corresponds to the top surface of tape 2. Ends 24 of conductive paths 14 are electrically connected to external terminals 11 at certain of vias 15 and 26 in layers 9 and 8 while ends 25 of conductive paths 14 are electrically connected to internal terminals 10 at other of vias 15 and 26 (see FIG. 10).

The arrays of internal, external, and optional test terminals, and the geometric configuration of conductive paths 14 are selected so as to achieve a desired pattern of land areas. While the exact configuration of the terminals and paths is not critical to the invention, they must be selected so as to correspond to those required for interconnection to the electronic component and the external circuitry, and so as to avoid any undesired electrical interconnections, that is short-circuiting. Within these parameters then, a wide variety of designs and configurations may be utilized.

The insulating material of layers 8 and 9 is flexible and is preferably in the range of 2.5-250 microns in thickness. Useful insulating materials include thin, flexible films of polyimide, polyester, acrylic, fluorocarbon, polysulfone, polyamide, poly(imide-amide), silicone, and glass fiber reinforced thermoset plastics.

The various terminals and conductive paths utilized in the tape are preferably metals such as aluminum, copper, nickel, silver, gold, tin and the like. Alloys of these metals either with each other or with other metals are also useful. Bimetal terminals, for example solder-plated copper, tin-plated copper or gold-plated nickel, are also useful. The thickness of the various terminals and paths must be at least sufficient to allow electrical conductivity and they may be as thick as 125 microns, although thinner terminals and paths, such as 10 to 15 microns, are generally preferred for reasons of economics.

Figure 10:

The various terminals utilized throughout the tape 2 may have any geometric shape and dimension desired. Thus, for example, they may be circular, rectangular, triangular, etc. Generally the terminals in a given array are all of the same dimensions although they need not be so. Thus, for example, circular terminals may have diameters of from 25 to 500 microns. Terminals of other shapes will commonly have surface areas corresponding to those of the circular terminals. Additionally, the terminals may comprise raised areas which extend beyond bottom surface 21 of tape 2 or, alternatively, they may comprise recessed areas as are shown in FIG. 10.

The pattern of the various arrays of terminals may also be varied. Thus, the array of internal terminals 10 may comprise a multiplicity of horizontal and vertical rows of metal land areas as is shown in FIGS. 2-4, 11, and 13. This array is, of course, merely descriptive and may be varied to suit the pattern of the bonding locations of the electronic component to which it is to be attached.

The array of external terminals 11 is preferably peripherally situated about the array of internal terminals 10. It may comprise a single row of terminals which surrounds the array of internal terminals 10 as is shown in FIGS. 2-4 and 11, or it may comprise a double row of terminals as is shown in FIG. 13. Again, the exact pattern of the array of external terminals 11 may be varied to meet the pattern of the bonding locations of the external circuitry to which it is to be attached. It is not necessary that the array of external terminals 11 totally surround the array of internal terminals 10.

The array of test terminals 20 may also vary in its pattern. Thus, while the FIGURES show the array as a row of land areas which surrounds the array of external terminals 11 other patterns may be utilized if desired.

Figures 11, 12:
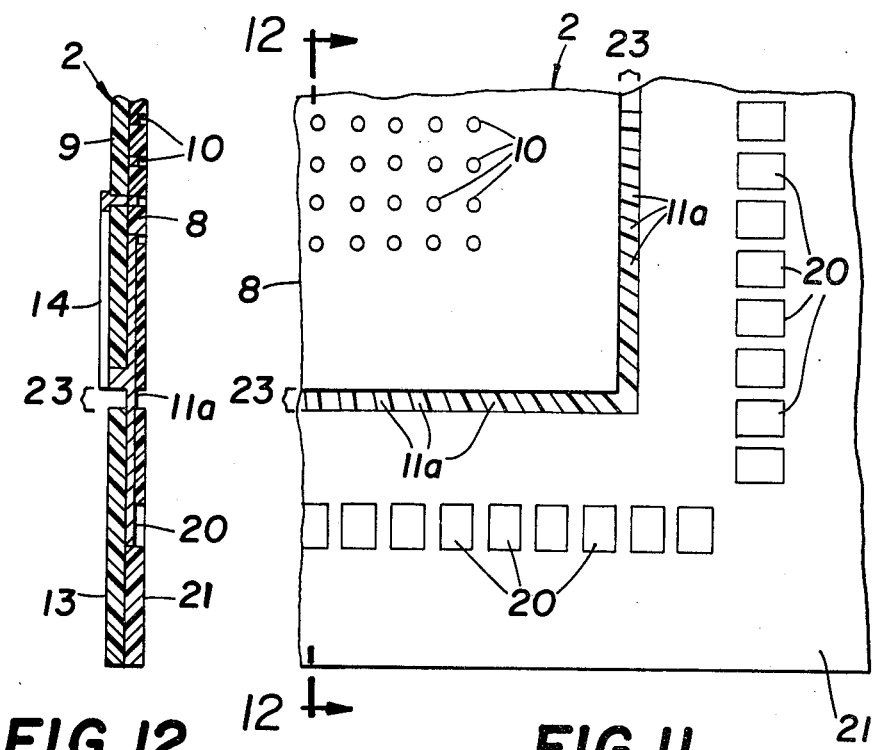
FIG. 11 shows an alternative embodiment of the invention.
FIG. 12 shows a cross-sectional view of the embodiment of FIG. 11 taken along line 12—12.
Figure 13:
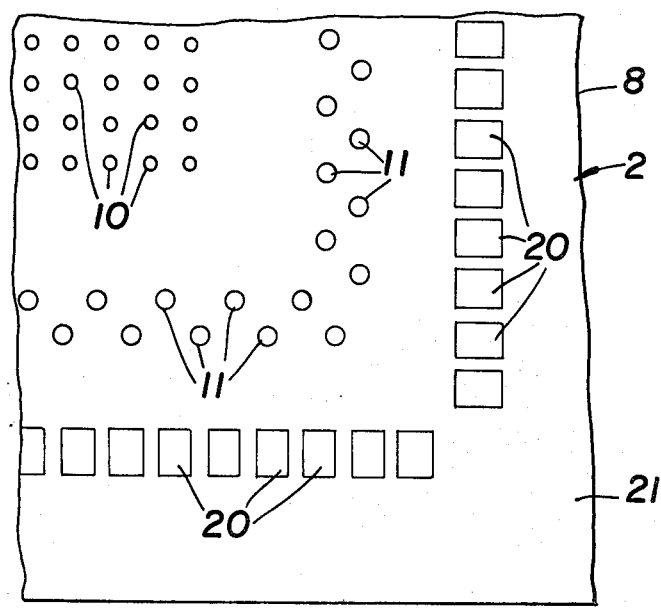
FIG. 13 shows another embodiment of the invention.

FIGS. 11 and 12 show an alternative embodiment of the present invention wherein a portion of the flexible insulating body, here layers 8 and 9 has been removed to leave a cutaway portion 23 to provide external terminals 11a on conductive paths 14. Cutaway portion 23 is provided so that the tape 2 may be easily cut along the line of this portion and separate the array of test terminals 20 from the remainder of the tape. After removing the array of test terminals 20, the array of external terminals 11 preferably comprise a plurality of cantilevered beams.

In use tape 2 is applied to an electronic component such as a semiconductor chip 3 so that the array of internal contacts 10 is disposed to be in registered contact with bonding locations 4. The tape 2 is then bonded to the bonding locations 4 of chip 3. Chip 3 may then be functionally tested by probing test terminals 20 with electronic test equipment. If the chip 3 is faulty, it may be discarded at this time. If the chip 3 is good, test terminals 20, if present, are removed from tape 2 so that the remainder of tape 2 extends beyond the array of external terminals 11. The array of external terminals 11 is then disposed to be in registered contact with the external circuitry to which the semiconductor chip 3 is to be attached and the tape 2 is bonded to the bonding locations on package 5. Bonding tape 2 to semiconductor chip 3 and the external circuitry may be accomplished by, for example, reflow soldering, thermo-compression techniques or ultrasonic techniques to form a metallurgical bond between internal and external contacts 10 and 11 and the appropriate bonding locations. The resulting assembled device is then ready for use.

Figure 5:
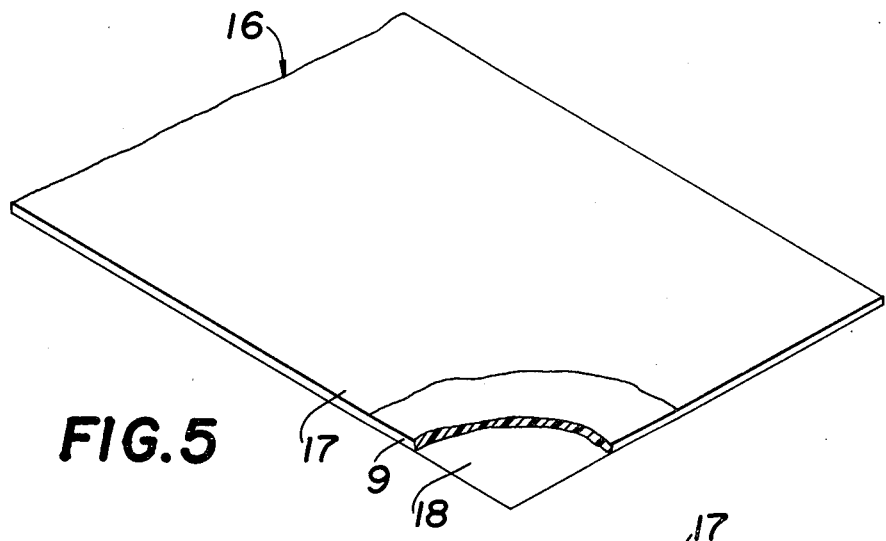
FIGS. 5-10 show sequential steps in one method for the manufacture of the area-bonding tape of the invention.
Figure 6:
Figure 7:
Figure 8:

The tape 2 may be prepared by a number of techniques. The following procedure represents one of such techniques. Reference to FIGS. 5-10 will aid in understanding this procedure. FIG. 5 shows a thin metallized film 16 comprising a thin (e.g., 25 to 125 microns) dielectric substrate 9 having thin conductive layers 17 and 18 on opposed surfaces. Preferably this film comprises a material such as Kapton ® H-film while the conductive films each preferably comprise a layer of copper deposited or electroplated thereon. Kapton ® H-film is commercially available from E. I. duPont de Nemours and Company.

Metallized film 16 may have a plurality of sprocket holes (not shown) along the longitudinal edges thereof to aid in its manufacture and use.

Metallized film 16 is shaped to the desired dimensions, for example by cutting, and may then be cleaned by means of techniques known to the art so as to remove contaminants from its surface. Holes 19 (see FIG. 6) are then provided in conductive layer 18 by applying a layer of a photoresist (not shown) over layer 18, exposing the photoresist to activating radiation in an image-wise manner so as to provide areas which will ultimately correspond to holes 19, developing the layer of photoresist so as to remove the photoresist from those areas desired to correspond to holes 19, and etching the copper in the exposed areas so as to provide holes 19. Photoresist materials and techniques for applying, imaging, and developing them are known. Etching materials and techniques for employing them are also known.

Holes 15 (see FIG. 7) are then provided in layer 9 by etching the material of layer 9. This may leave a thin film of the material of layer 9 along the underside of conductive surface 17 which must be removed. This may be accomplished by using any of several dry processing techniques such as plasma etching. The resulting hole then communicates directly with the underside of conductive layer 17. The various apertures and holes employed in this procedure can be formed according to conventional techniques, e.g., chemical milling (such as is described in U.S. Pat. No. 3,395,057), laser and electron beam drilling, abrasive techniques, mechanical drilling, plasma etching, or reactive ion milling.

Figure 9:

Terminals 10 and 11 (see FIG. 8) are then provided in these holes by common plating techniques such as electro deposition, and electroless plating. Preferably plating is continued until terminals 10 and 11 provide an essentially flat surface along the bottom of conductive layer 18. The photoresist is then removed from conductive layer 18 and a layer of a photoresist (not shown) is applied over conductive layers 17 and 18 and terminals 10 and 11. The photoresist is then image-wise exposed so as to create a differential pattern thereon which ultimately will correspond to the desired pattern of conductive paths 14 which will interconnect the terminals 10 and 11 in the desired fashion. After exposure, the photoresist is developed, the exposed copper is etched to provide the desired patterns of conductive paths 14, and the remaining photoresist is then removed. FIG. 9 represents a cross-sectional view of a portion of the resulting structure.

A coating of a curable material, such as polyamic acid (e.g., Pyre ML from E. I. duPont de Nemours and Company) is then applied over one surface of the intermediate structure of FIG. 9 from a solution of the acid. After the solvent has been removed from the layer, holes 26 are then provided by applying a photo resist to the layer, imaging the photoresist in the desired fashion, developing the photoresist, chemically etching the polyamic acid with, for example, a basic solution, and removing the remaining photoresist. The polyamic acid is then converted to polyimide by the application of heat or by exposure to actinic radiation such as is shown in U.S. Pat. No. 4,242,437. A cross-sectional view of the resulting structure is shown in FIG. 10.

I claim:

1. A flexible area-bonding tape for providing electrical interconnection between electronic components and external circuitry, said tape comprising a flexible, solid, electrically insulating body having multiplicity of conductive paths provided in more than one level, at least some of said conductive paths being essentially completely embedded along horizontal paths in said body, a predetermined array of internal terminals for electrical interconnection to said electronic components, a predetermined array of external terminals for electrical interconnection to said external circuitry, said internal and external terminals being electrically interconnected by said conductive paths.

2. A tape according to claim 1 wherein said array of external terminals is disposed about the periphery of said array of internal terminals.

3. A tape according to claim 1 wherein said array of internal terminals comprises a multiplicity of horizontal and vertical rows of first metal land areas.

4. A tape according to claim 3 wherein said array of external terminals comprises a row of second metal land areas around the periphery of said array of internal contacts.

5. A tape according to claim 4 wherein said second metal land areas have essentially none of said insulating body therearound.

6. A tape according to claim 1 further comprising an array of test terminals, wherein said test terminals are electrically interconnected to said external terminals, and wherein said array of test terminals is disposed about the periphery of said array of external terminals.

7. A tape according to claim 6 wherein said array of test terminals comprises a row of third metal land areas around the periphery of said array of external terminals.

8. A tape according to claim 1 wherein said insulting material is a polyimide.

9. A method for providing electrical interconnection between an electronic component and external circuitry, the method comprising the steps of (a) providing a flexible area-bonding tape comprising a flexible, solid, electrically insulating body having a multiplicity of conductive paths provided in more than one level, at least some of said conductive paths being essentially completely embedded along horizontal paths in said body, a predetermined array of internal terminals for electrical interconnection to said electronic components, a predetermined array of external components for electrical interconnection to said external circuitry, said internal and external terminals being electrically interconnected by said conductive paths;

(b) aligning said array of internal terminals with the bonding locations on said electronic component;

(c) bonding said array of internal terminals to said bonding locations on said electronic component;

(d) aligning said array of external terminals with the bonding locations on said external circuitry; and (e) bonding said array of external terminals to said bonding locations on said external circuitry.

* * * * *

UNITED STATES PATENT AND TRADEMARK OFFICE
CERTIFICATE OF CORRECTION

PATENT NO.  : 4,472,876
DATED       : September 25, 1984
INVENTOR(S) : J. Robert Nelson It is certified that error appears in the above-identified patent and that said Letters Patent is hereby corrected as shown below:

Col. 4, line 9, add --See Figure 10-- after "26".

Col. 4, line 12, Delete "See Figure 10".

Col. 6, line 53, after "having" insert --a--.

Signed and Sealed this

Ninth Day of April 1985

[SEAL]

Attest:

DONALD J. QUIGG

Attesting Officer     Acting Commissioner of Patents and Trademarks